United States Patent [19]
Yamane et al.

[11] Patent Number: 6,011,713
[45] Date of Patent: Jan. 4, 2000

[54] STATIC RANDOM ACCESS MEMORY INCLUDING POTENTIAL CONTROL MEANS FOR WRITING DATA IN MEMORY CELL AND WRITE METHOD FOR MEMORY CELL

[75] Inventors: Fumiyuki Yamane, Kawasaki; Tadahiro Kuroda, Yokohama, both of Japan; Toshinari Takayanagi, Cupertino; Masataka Matsui, San Jose, both of Calif.; Yasuo Unekawa, Yokohama; Tetsu Nagamatsu, Kawasaki, both of Japan

[73] Assignee: Kabushiki Kaisha Toshiba, Kawasakishi, Japan

[21] Appl. No.: 08/995,769

[22] Filed: Dec. 22, 1997

[30] Foreign Application Priority Data

Dec. 25, 1996 [JP] Japan .................................. 8-346053

[51] Int. Cl.⁷ .................................................. G11C 11/00
[52] U.S. Cl. .......................... 365/156; 365/154; 365/227
[58] Field of Search .................................... 365/156, 154, 365/227

[56] References Cited

U.S. PATENT DOCUMENTS

| | | | |
|---|---|---|---|
| 5,278,459 | 1/1994 | Matsui et al. | |
| 5,581,500 | 12/1996 | D'Souza | 365/154 |
| 5,621,693 | 4/1997 | Nakase | 365/227 |
| 5,668,770 | 9/1997 | Itoh et al. | 365/227 |
| 5,715,191 | 2/1998 | Yamauchi et al. | 365/156 |

*Primary Examiner*—David Nelms
*Assistant Examiner*—Hoai V. Ito
*Attorney, Agent, or Firm*—Loeb & Loeb LLP

[57] ABSTRACT

A semiconductor memory includes a memory cell including inverters (IN1, IN2), control transistors (T3, T4) that control the potential of a ground side terminal (N3) connected to the memory cell, and transfer transistors T1 and T2 that control transfer of data from bit lines (BL, /BL) to the memory cell. In writing data, the control transistors raise the potential of the ground side terminal (N3) to be higher than the ground potential by a predetermined potential. After the transfer transistors transfer data having a potential difference smaller than a potential difference between the power supply potential and the ground potential from the bit lines (BL, /BL) to the memory cell, and cause the memory cell to hold the data, the potential of the ground side terminal (N3) is decreased to the ground potential to write data. Since data written in the memory cell suffices to have a potential difference smaller than the potential difference between the power supply potential and the ground potential, the time required to drive the bit line having a large load capacitance is shortened, the power consumption is decreased, and the power consumption necessary for writing data in the memory cell is reduced.

8 Claims, 5 Drawing Sheets

STATIC RANDOM ACCESS MEMORY INCLUDING POTENTIAL CONTROL MEANS FOR WRITING DATA IN MEMORY CELL AND WRITE METHOD FOR MEMORY CELL

BACKGROUND OF THE INVENTION

The present invention relates to a write method for a semiconductor memory cell and particularly an SRAM (Static Random Access Memory) memory cell, and a semiconductor memory circuit device.

FIG. 7 shows the arrangement of a 1-bit SRAM memory cell as a semiconductor memory circuit device related to the present invention. Two inverters IN1 and IN2 are cross-coupled to each other. The two terminals of a switching transistor T1 are connected between one connection node N1 and a bit line BL. The two terminals of a switching transistor T2 are connected between the other connection node N2 and a bit line /BL. The gates of the transistors T1 and T2 are connected to word lines WL. The inverters IN1 and IN2 are respectively connected to a power supply terminal PL and a ground terminal GL.

A write operation in this device will be explained with reference to a timing chart in FIG. 8. The following description is related to the case of writing logically inverted data (the potential of the node N1 is the ground potential, and that of the node N2 is the power supply potential) for data (the potential of the node N1 is the power supply potential, and that of the node N2 is the ground potential) stored in an SRAM memory cell at that time.

Write procedures are classified into Method 1 in which data is input to the bit line simultaneously when or after raising the potential of the word line, as shown in FIG. 8(a), and Method 2 in which the potential of the word line is raised after inputting data to the bit line, as shown in FIG. 8(b).

(Method 1)

Up to time t1, the bit lines BL and /BL are kept precharged to the reference potential. The power supply line PL is at the power supply potential, and the ground line GL is at the ground potential. In this case, the reference potential is the power supply potential, but may be the ground potential or intermediate potential. In this stage, of the two nodes N1 and N2 cross-coupling the inverters IN1 and IN2 in the above-described manner, the node N1 holds the power supply potential, and the node N2 is at the ground potential.

For a time interval from time t1 to time t2, the potential of the word line WL rises to turn on the switching transistors T1 and T2.

At the same time as or after time t1, the potential of the bit line BL is changed to the ground potential (logic "0"), whereas that of the bit line /BL to the power supply potential (logic "1"). Data is written via the transistors T1 and T2 in the ON state, and the potentials of the nodes N1 and N2 respectively change to the ground potential and the power supply potential. As a result, the data is written in the SRAM memory cell.

For a time interval from time t3 to time t4, the potential of the word line WL is decreased to the ground potential to turn off the transistors T1 and T2. From time t4, the bit lines BL and /BL are precharged to the reference potential.

(Method 2)

Similar to Method 1, up to time t1, the bit lines BL and /BL are kept precharged to the reference potential. The power supply line PL is at the power supply potential, and the ground line GL is at the ground potential. The node N1 is at the power supply potential, and the node N2 is at the ground potential.

From time t1, the bit lines BL and /BL are respectively changed to the ground potential and the power supply potential. For a time interval from time t2 to time t3 after the bit lines BL and /BL respectively reach the corresponding potentials, the potential of the word line WL is raised to turn on the transistors T1 and T2. Then, data is written, and the potentials of the nodes N1 and N2 respectively change to the power supply potential and the ground potential.

For a time interval from time t4 to time t5, the potential of the word line WL is decreased to turn off the transistors T1 and T2. From time t5, the bit lines BL and /BL are precharged to the reference potential.

This device has the following problems. As described above, in writing data, the bit lines BL and /BL must have a potential difference between the power supply potential and the ground potential. Since the load of the bit line is very heavy, a long time is required to drive the bit lines BL and /BL so as to attain a potential difference between the power supply potential and the ground potential, increasing the power consumption. During a write, the current amount flowing from the power supply terminal to the ground terminal, and the current amount flowing from the bit line to the ground terminal are large, increasing the power consumption. Also in precharging the bit line upon a write, a long time is required to increase the power consumption because the potential difference between the bit lines BL and /BL is large.

SUMMARY OF THE INVENTION

It is, therefore, an object of the present invention to provide a semiconductor memory circuit device and a write method for a semiconductor memory cell in which the time and power consumption required for a write, and the time and power consumption required for a precharge can be reduced.

According to the present invention, there is provided a semiconductor memory circuit device comprising a semiconductor memory cell for holding data, potential control means for controlling a potential of a ground side terminal connected to the semiconductor memory cell, and transfer control means for controlling transfer of data from a bit line to the semiconductor memory cell, wherein, after the potential control means raises the potential of the ground side terminal to be higher than a ground potential by a predetermined potential in writing data, and the transfer control means transfers data having a potential difference smaller than a potential difference between a power supply potential and the ground potential from the bit line to the semiconductor memory cell, and causes the semiconductor memory cell to hold the data, the potential of the ground side terminal is decreased to the ground potential.

The semiconductor memory cell may have two cross-connected inverters, the potential control means may have a P-channel MOS transistor which has two terminals connected between the ground side terminal commonly connected to the two inverters, and a ground potential terminal, and receives a first control signal at a gate, and an N-channel MOS transistor which has two terminals connected parallel to the P-channel MOS transistor between the ground side terminal and the ground potential terminal, and receives a second control signal at a gate, the transfer control means may have switching means having two terminals respectively connected between first and second nodes cross-connecting the two inverters, and a pair of bit lines, and after the P-channel MOS transistor of the potential control means is turned on by the first control signal to raise the potential of the ground side terminal to be higher than the ground potential by a threshold voltage and an ON resistance, and the switching means of the transfer control means transfers the data from the pair of bit lines to the semiconductor memory cell, and causes the semiconductor memory cell to hold the data, the N-channel MOS transistor of the potential control means may be turned on by the first control signal, or the N-channel MOS transistor and the P-channel MOS transistor may be turned on by the first and second control signals to decrease the potential of the ground side terminal to the ground potential.

An N-channel MOS transistor having a high ON resistance may be used instead of the P-channel MOS transistor.

The semiconductor memory circuit device may comprise connection control means for controlling connection of the semiconductor memory cell and a power supply potential terminal, or supply current control means for controlling a supply current from the power supply potential terminal to the semiconductor memory cell.

According to the present invention, there is provided a method of writing data in a semiconductor memory cell, comprising the steps of, in a write, raising a potential of a ground side terminal connected to the semiconductor memory cell to be higher than a ground potential by a predetermined potential, supplying data having a potential difference smaller than a potential difference between a power supply potential and the ground potential to the semiconductor memory cell to write the small potential difference, and decreasing the potential of the ground side terminal to the ground potential, and amplifying the written small potential difference when the data written in the semiconductor memory cell is not destroyed even if the potential of the ground side terminal is decreased to the ground potential.

According to the present invention, there is provided another method comprising the steps of raising a potential of a ground side terminal connected to the semiconductor memory cell to be higher than a ground potential by a predetermined potential, and disconnecting a power supply side terminal connected to the semiconductor memory cell from a power supply potential terminal, or decreasing a supply current from a power supply potential terminal to the semiconductor memory cell, supplying data having a potential difference smaller than a potential difference between a power supply potential and the ground potential to the semiconductor memory cell to write the small potential difference, and decreasing the potential of the ground side terminal to the ground potential, and connecting the power supply side terminal and the power supply potential terminal, or increasing the supply current from the power supply potential terminal to the semiconductor memory cell when the data written in the semiconductor memory cell is not destroyed even if the potential of the ground side terminal is decreased to the ground potential.

According to the present invention, a small potential difference is written while the potential of the ground side terminal of the memory cell is raised higher than the ground potential in the initial stage of a write, and the power supply side terminal of the memory cell is disconnected from the power supply potential terminal, or the supply current from the power supply potential terminal to the memory cell is decreased. Thereafter, the potential of the ground side terminal of the memory cell is decreased to the ground potential, and the power supply side terminal of the memory cell is connected to the power supply potential terminal, or the supply current from the power supply potential terminal to the memory cell is increased. With this operation, the write time and power consumption and the precharge time and power consumption can be reduced, compared to the conventional device in which a potential difference between the power supply potential and the ground potential must be written in the bit line.

DESCRIPTION OF THE PREFERRED EMBODIMENTS

Figure 1:
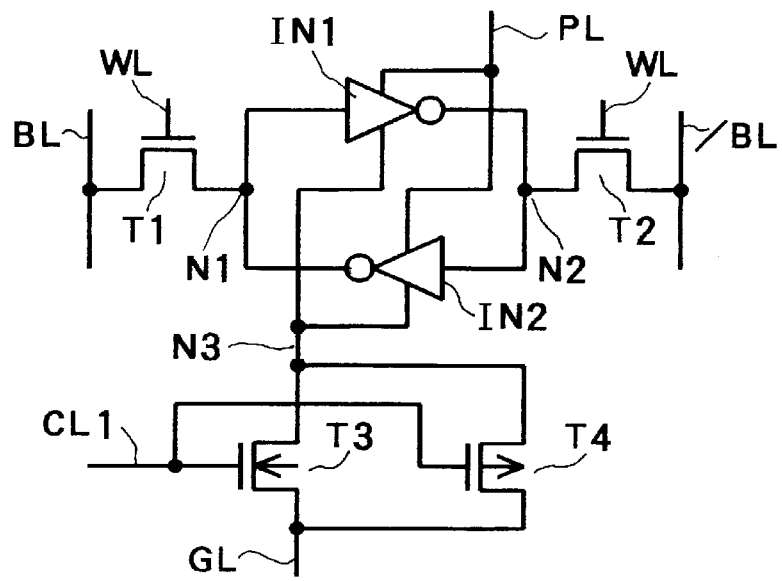
FIG. 1 is a circuit diagram showing the arrangement of a semiconductor memory circuit device according to the first embodiment of the present invention.

An embodiment of the present invention will be described below with reference to the accompanying drawings. FIG. 1 shows the arrangement of a semiconductor memory circuit device according to the first embodiment of the present invention. Two inverters IN1 and IN2 are cross-coupled to each other. The two terminals of a switching transistor T1 are connected between one connection node N1 and a bit line BL. The two terminals of a switching transistor T2 are connected between the other connection node N2 and a bit line /BL. The gates of both the transistors T1 and T2 are connected to word lines WL.

Figure 7:
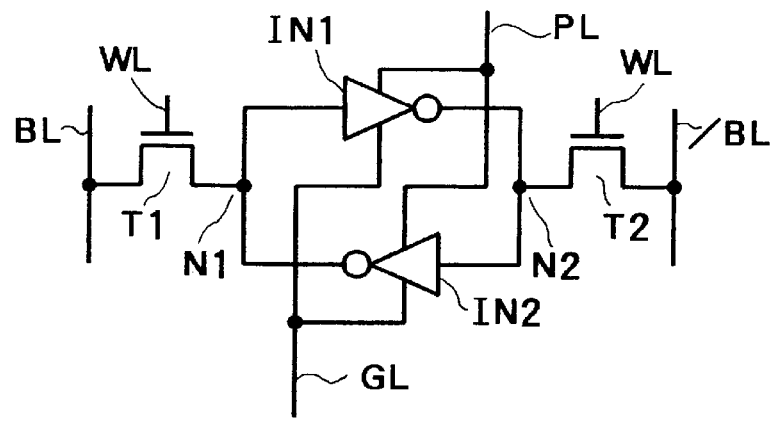
FIG. 7 is a circuit diagram showing the arrangement of a semiconductor memory circuit device related to the present invention.
Figures 8A, 8B:
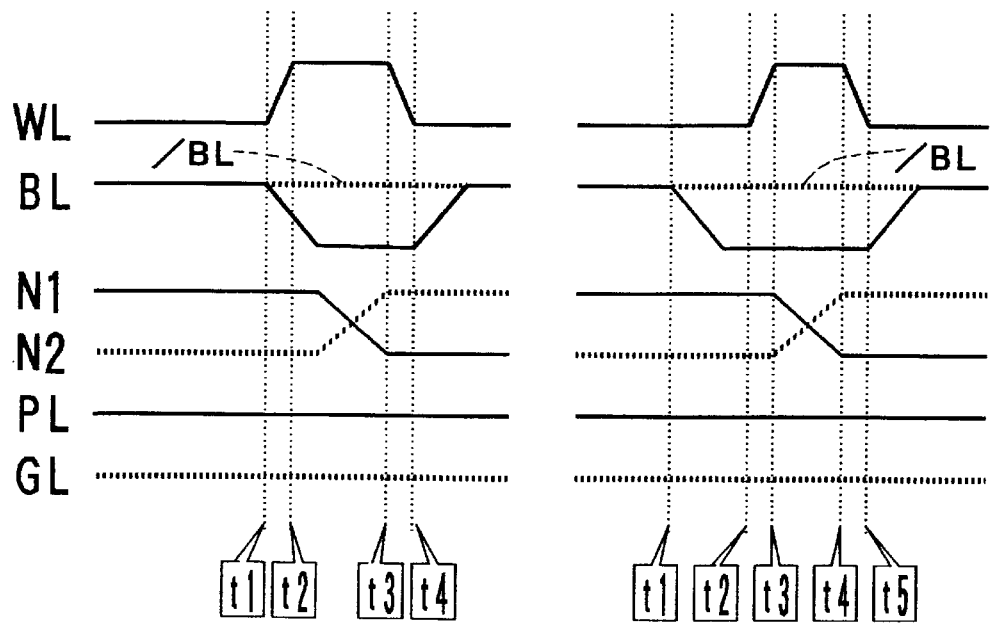
FIGS. 8(a) and 8(b) are timing charts showing the respective signal waveforms in the device.

In the device shown in FIG. 7, the inverters IN1 and IN2 are respectively connected to the power supply terminal PL and the ground terminal GL. In the first embodiment, the inverters IN1 and IN2 are connected to a power supply terminal PL and a node N3, and the two terminals of each of a P-channel transistor T4 and an N-channel transistor T3 are parallel-connected between the node N3 and a ground terminal GL. The gates of the transistors T4 and T3 are connected to a control line CL1.

Figures 2A, 2B:
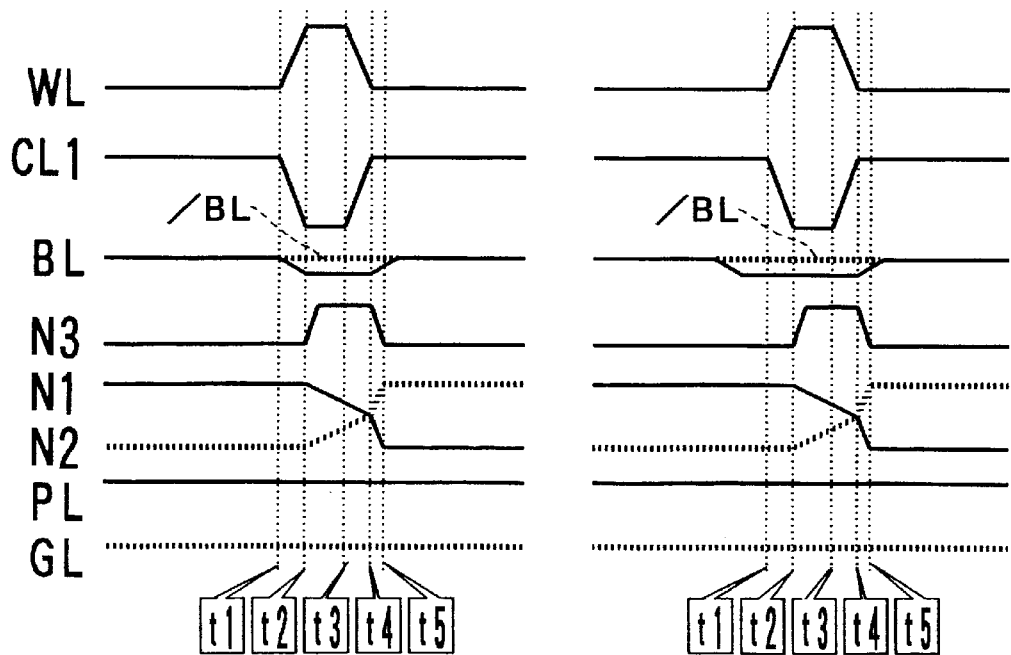
FIGS. 2(a) and 2(b) are timing charts showing the respective signal waveforms in the device.

A write operation in the first embodiment will be described below with reference to FIGS. 2(a) and 2(b) showing the potential waveform at each node. Write operations are classified into Method 1 in which data is input to the bit line simultaneously when or after raising the potential of the word line, as shown in FIG. 2(a), and Method 2 in which the potential of the word line is raised after inputting data to the bit line, as shown in FIG. 2(b).

(Method 1)

The bit lines BL and /BL are precharged to the reference potential. The control line CL1 is at the power supply potential, and the node N3 is at the ground potential. The N-channel MOS transistor T3 is in the ON state, and the P-channel MOS transistor T4 is in the OFF state.

For a time interval from time t1 to time t2, the potential of the word line WL rises to the power supply potential to turn on the switching transistors T1 and T2. At the same time as or before/after time t1, the control line CL1 starts falling to the ground potential. Then, the N-channel MOS transistor T3 is turned off while the P-channel MOS transistor T4 maintains the OFF state. This is because the node N3 is at the ground potential, and the transistor T4 holds the potential Vgs between the gate and source<|threshold Vthp|.

At the same time as or after time t1, data is input to the bit lines BL and /BL. In the conventional device, the potential difference of the data, i.e., the potential difference between the bit lines BL and /BL must be a difference between the power supply potential and the ground potential. In the first embodiment, however, the potential difference of the data suffices to be small to a degree capable of writing data in the cross-connected inverters IN1 and IN2 when the potential of the node N3 rises higher than the ground potential. When the transistors T1 and T2 are turned on, a current path extending from the bit line BL or /BL to the node N3 is formed via transistors constituting the inverters IN1 and IN2, a current flows, and the potential of the node N3 starts rising.

When the potential of the node N3 starts rising from time t2, and the potential Vgs between the gate and source of the transistor T4 becomes equal to or higher than the absolute value of the threshold voltage Vthp, the transistor T4 in the OFF state is turned on. A current flows through the transistor T4 to raise the potential of the node N3 by the ON resistance of the transistor T4.

The potential difference between the bit lines BL and /BL is written as data in the inverters IN1 and IN2. Although the potential difference between the bit lines BL and /BL is smaller than that between the power supply potential and the ground potential, as described above, data can be written in the inverters IN1 and IN2 by raising the potential of the node N3. Accordingly, data is written from time t2 to generate a small potential difference between the nodes N1 and N2. The potentials held by the inverters IN1 and IN2, i.e., the potentials of the nodes N1 and N2 reach a potential difference with which the data is not destroyed when the potential of the node N3 is decreased to the ground potential.

Simultaneously when the potential difference between the nodes N1 and N2 reaches the value with which the data is not destroyed even if the potential of the node N3 is decreased to the ground potential, or for a subsequent time interval from time t3 to time t4, the potential of the word line WL is decreased. At the same time as or after time t3, the potential of the control line CL1 is raised to the power supply potential. Then, the transistor T4 is turned off, whereas the transistor T3 is turned on. Simultaneously when the potential of the word line WL falls to the ground potential at time t4 to turn off the transistors T1 and T2, precharge of the bit lines BL and /BL starts to raise the potential of the bit line BL to the reference potential.

Since the P-channel MOS transistor T4 is turned off, and the N-channel MOS transistor T3 is turned on, the potential of the node N3 falls to the ground potential, and the small potential difference written in the inverters IN1 and IN2, i.e., the potential difference between the nodes N1 and N2 is amplified to a difference between the power supply potential and the ground potential.

(Method 2)

The bit lines BL and /BL are precharged to the reference potential. The control line CL1 is at the power supply potential, and the node N3 is at the ground potential. The N-channel MOS transistor T3 is in the ON state, and the P-channel MOS transistor T4 is in the OFF state.

Before time t1, data is input to the bit lines BL and /BL. Similar to Method 1, the potential difference of the data, i.e., the potential difference between the bit lines BL and /BL is small to a degree capable of writing data in the cross-connected inverters IN1 and IN2 when the potential of the node N3 rises higher than the ground potential. At the same time as or before/after input of the data to the bit lines BL and /BL, the potential of the control line CL1 is decreased. Then, the transistor T3 is turned off, while the transistor T4 maintains the OFF state due to the above-described reason.

For a time interval from time t1 to time t2, the potential of the word line WL rises to the power supply potential to turn on the switching transistors T1 and T2. Accordingly, a current path extending from the bit line BL or /BL to the node N3 is formed via the transistors constituting the inverters IN1 and IN2, a current flows, and the potential of the node N3 starts rising.

When the potential of the node N3 starts rising from time t2, and the potential Vgs between the gate and source of the transistor T4 becomes equal to or higher than the absolute value of the threshold voltage Vthp, the transistor T4 in the OFF state is turned on. A current flows through the transistor T4 to raise the potential of the node N3 by the ON resistance of the transistor T4.

The potential difference between the bit lines BL and /BL is written as data in the inverters IN1 and IN2. From time t2, data is written to generate a small potential difference between the nodes N1 and N2. The potentials held by the inverters IN1 and IN2, i.e., the potentials of the nodes N1 and N2 reach a potential difference with which the data is not destroyed when the potential of the node N3 is decreased to the ground potential.

For a time interval from time t3 to time t4, the potential of the word line WL falls. At the same time as or after time t3, the potential of the control line CL1 rises to the power supply potential. Then, the transistor T4 is turned off, whereas the transistor T3 is turned on. Simultaneously when the potential of the word line WL falls to the ground potential at time t4 to turn off the transistors T1 and T2, precharge of the bit lines BL and /BL starts to raise the potential of the bit line BL to the reference potential.

Since the P-channel MOS transistor T4 is turned off, and the N-channel MOS transistor T3 is turned on, the potential of the node N3 falls to the ground potential, and the small potential difference written in the inverters IN1 and IN2, i.e., the potential difference between the nodes N1 and N2 is amplified to a difference between the power supply potential and the ground potential.

According to the first embodiment, by either Method 1 or Method 2, data can be written in the bit lines BL and /BL with a small potential difference by raising the potential of the node N3 connected to the inverters IN1 and IN2 to be higher than the ground potential in writing data, and then decreasing it to the ground potential. That is, of the P-channel MOS transistor T4 and the N-channel MOS transistor T3 which are parallel-connected to the node N3 and the ground line GL, only the P-channel MOS transistor T4 is turned on. The potential of the node N3 is raised by the threshold voltage and the ON resistance. Data as a small potential difference is written between the bit lines BL and /BL, and held by the inverters INI and IN2. Thereafter, the P-channel MOS transistor T4 is turned off, and only the N-channel MOS transistor T3 is turned on to decrease the potential of the node N3 to the ground potential. With this operation, the small potential difference can be amplified to the potential difference of data which should be originally held by the inverters IN1 and IN2.

According to the first embodiment, if the potential of the node N3 serving as the ground side terminal of the memory cell is set higher than the ground potential in the initial stage of a write, a potential difference necessary for a write can be reduced to set a potential difference between the bit lines BL and /BL to be smaller than the conventional one. As a result, the time and power consumption required to drive the bit lines BL and /BL having a heavy load can be reduced.

Since changes in potentials of the bit lines BL and /BL in the initial stage of a write can be suppressed small, the time and power consumption required to precharge the bit line having undergone a write to the reference potential can be reduced.

Since the potential of the node N3 is higher than the ground potential in the initial stage of a write, the potentials of the ground side terminals of the transistors constituting the inverters IN1 and IN2 rise. Accordingly, the current amount flowing from the bit lines BL and /BL and the power supply side terminal to the node N3 at the beginning of a write can be decreased.

In raising the potential of the node N3, only the P-channel MOS transistor T4 is turned on; in decreasing the potential of the node N3, only the N-channel MOS transistor T3 is turned on. However, in not only raising but also decreasing the potential of the node N3, the P-channel MOS transistor T4 may be turned on together with the N-channel MOS transistor T3.

Figure 3:
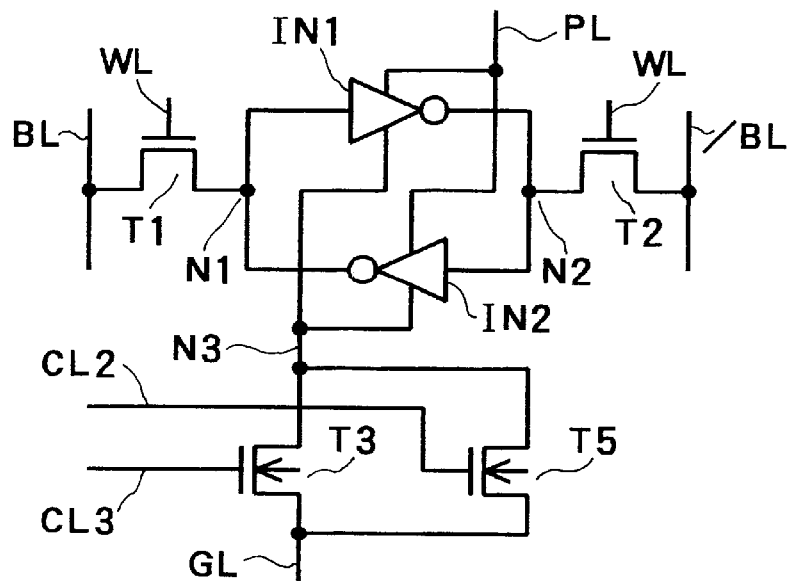
FIG. 3 is a circuit diagram showing the arrangement of a semiconductor memory circuit device according to the second embodiment of the present invention.

FIG. 3 shows the arrangement of a semiconductor memory circuit device according to the second embodiment of the present invention. The second embodiment is different from the first embodiment in that an N-channel MOS transistor T5 replaces the P-channel MOS transistor T4. The transistor T5 has an ON resistance higher than that of a transistor T3. The transistor T5 is controlled by the potential of a control line CL2, while the transistor T3 is controlled by the potential of a control line CL3.

Figures 4A, 4B:
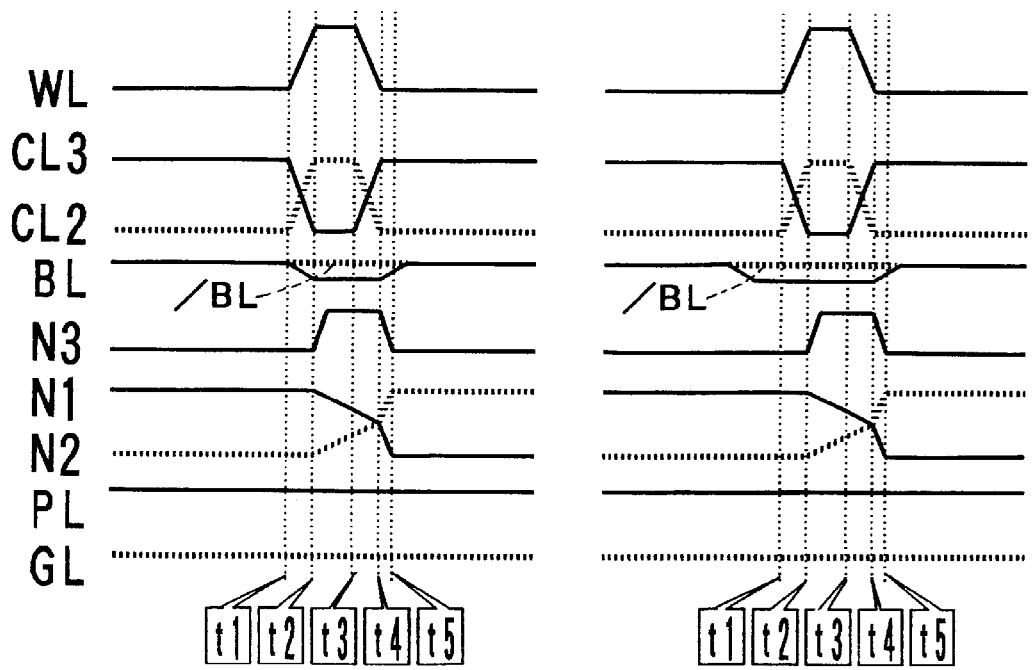
FIGS. 4(a) and 4(b) are timing charts showing the respective signal waveforms in the device.

Also in the second embodiment, write operations are classified into Method 1 in which data is input to the bit line simultaneously when or after raising the potential of the word line, as shown in FIG. 4(a), and Method 2 in which the potential of the word line is raised after inputting data to the bit line, as shown in FIG. 4(b).
(Method 1)

Bit lines BL and /BL are precharged to the reference potential. The control line CL3 is at the power supply potential, the transistor T3 is in the ON state, the control line CL2 is at the ground potential, the transistor T5 is in the OFF state, and a node N3 is at the ground potential.

For a time interval from time t1 to time t2, the potential of a word line WL rises to the power supply potential to turn on switching transistors T1 and T2. At the same time as or before/after time t1, the potential of the control line CL3 starts falling to the ground potential, and the potential of the control line CL2 starts rising to the power supply potential. Then, the transistor T3 is turned off, and the transistor T5 is turned on.

At the same time as or after time t1, data is input to the bit lines BL and /BL. Similar to the first embodiment, the potential difference of the data, i.e., the potential difference between the bit lines BL and /BL is small to a degree capable of writing data in cross-connected inverters IN1 and IN2 when the potential of the node N3 rises higher than the ground potential. When the switching transistors T1 and T2 are turned on, a current path extending from the bit line BL or /BL to the node N3 is formed via transistors constituting the inverters IN1 and IN2, a current flows, and the potential of the node N3 starts rising. The potential of the node N3 rises by the ON resistance of the transistor T5.

The potential difference between the bit lines BL and /BL is written as data in the inverters IN1 and IN2. Data is written from time t2 to generate a small potential difference between nodes N1 and N2. The potentials held by the inverters IN1 and IN2, i.e., the potentials of the nodes N1 and N2 reach a potential difference with which the data is not destroyed when the potential of the node N3 is decreased to the ground potential.

Simultaneously when the potential difference between the nodes N1 and N2 reaches the value with which the data is not destroyed even if the potential of the node N3 is decreased to the ground potential, or for a subsequent time interval from time t3 to time t4, the potential of the word line WL is decreased. At the same time as or after time t3, the potential of the control line CL3 is raised to the power supply potential to turn on the transistor T3. The potential of the control line CL2 is decreased to the ground potential to turn off the transistor T5. Simultaneously when the potential of the word line WL falls to the ground potential at time t4 to turn off the transistors T1 and T2, precharge of the bit lines BL and /BL starts to raise the potential of the bit line /BL to the reference potential.

Since the transistor T5 having a high ON resistance is turned off, and the transistor T3 having a low ON resistance is turned on, the potential of the node N3 falls to the ground potential, and the small potential difference written in the inverters IN1 and IN2, i.e., the potential difference between the nodes N1 and N2 is amplified to a difference between the power supply potential and the ground potential.
(Method 2)

The bit lines BL and /BL are precharged to the reference potential. The control line CL3 is at the power supply potential, the transistor T3 is in the ON state, the control line CL2 is at the ground potential, the transistor T5 is in the OFF state, and the node N3 is at the ground potential.

Before time t1, data is input to the bit lines BL and /BL. Similar to Method 1, the potential difference of the data, i.e., the potential difference between the bit lines BL and /BL is small. At the same time as or before/after input of the data to the bit lines BL and /BL, the potential of the control line CL3 is decreased, and the potential of the control line CL2 is raised. Then, the transistor T3 is turned off, while the transistor T5 is turned on.

For a time interval from time t1 to time t2, the potential of the word line WL rises to the power supply potential to turn on the switching transistors T1 and T2. Accordingly, a current path extending from the bit line BL or /BL to the node N3 is formed via the transistors constituting the inverters IN1 and IN2, a current flows, and the potential of the node N3 starts rising to be higher than the ground potential by the ON resistance of the transistor T5.

The potential difference between the bit lines BL and /BL is written as data in the inverters IN1 and IN2. From time t2, data is written to generate a small potential difference between the nodes N1 and N2. The potentials held by the inverters IN1 and IN2, i.e., the potentials of the nodes NI and N2 reach a potential difference with which the data is not destroyed when the potential of the node N3 is decreased to the ground potential.

For a time interval from time t3 to time t4, the potential of the word line WL falls. At the same time as or after time t3, the potential of the control line CL3 rises to the power supply potential to turn on the transistor T3. The potential of the control line CL2 is decreased to the ground potential to turn off the transistor T5. Simultaneously when the potential of the word line WL falls to the ground potential at time t4 to turn off the transistors T1 and T2, precharge of the bit lines BL and /BL starts to raise the potential of the bit line BL to the reference potential.

Since the N-channel MOS transistor T5 having a high ON resistance is turned off, and the N-channel MOS transistor T3 is turned on, the potential of the node N3 falls to the ground potential, and the small potential difference written in the inverters IN1 and IN2, i.e., the potential difference between the nodes N1 and N2 is amplified to a difference between the power supply potential and the ground potential.

According to the second embodiment, the same effects as in the first embodiment can be obtained. In addition, the second embodiment exhibits unique effects. In the first embodiment, since the P-channel MOS transistor T4 is used to raise the potential of the node N3, the node N3 is in the floating state until the transistor T4 is turned on. In the second embodiment, the N-channel MOS transistor T5 is used to raise the potential of the node N3. The N-channel MOS transistor T5 becomes in the ON state earlier than the P-channel MOS transistor T4, and the node N3 is not in the floating state to prevent a malfunction.

In raising the potential of the node N3, only the N-channel MOS transistor T5 having a high ON resistance is turned on; in decreasing the potential of the node N3, only the N-channel MOS transistor T3 is turned on. However, in not only raising but also decreasing the potential of the node N3, the N-channel MOS transistor T5 may be turned on together with the N-channel MOS transistor T3.

In the first and second embodiments, the P-channel transistor T4 or the N-channel transistor T5 is used to raise the potential of the node N3. Instead, a resistance element or a diode may be used to raise the potential of the node N3 by a conductive resistance. A pair of transistors T3 and T4 or T3 and T5 for controlling the potential of the node N3 may be arranged for each SRAM memory cell or in units of a plurality of memory cells.

Figure 5:
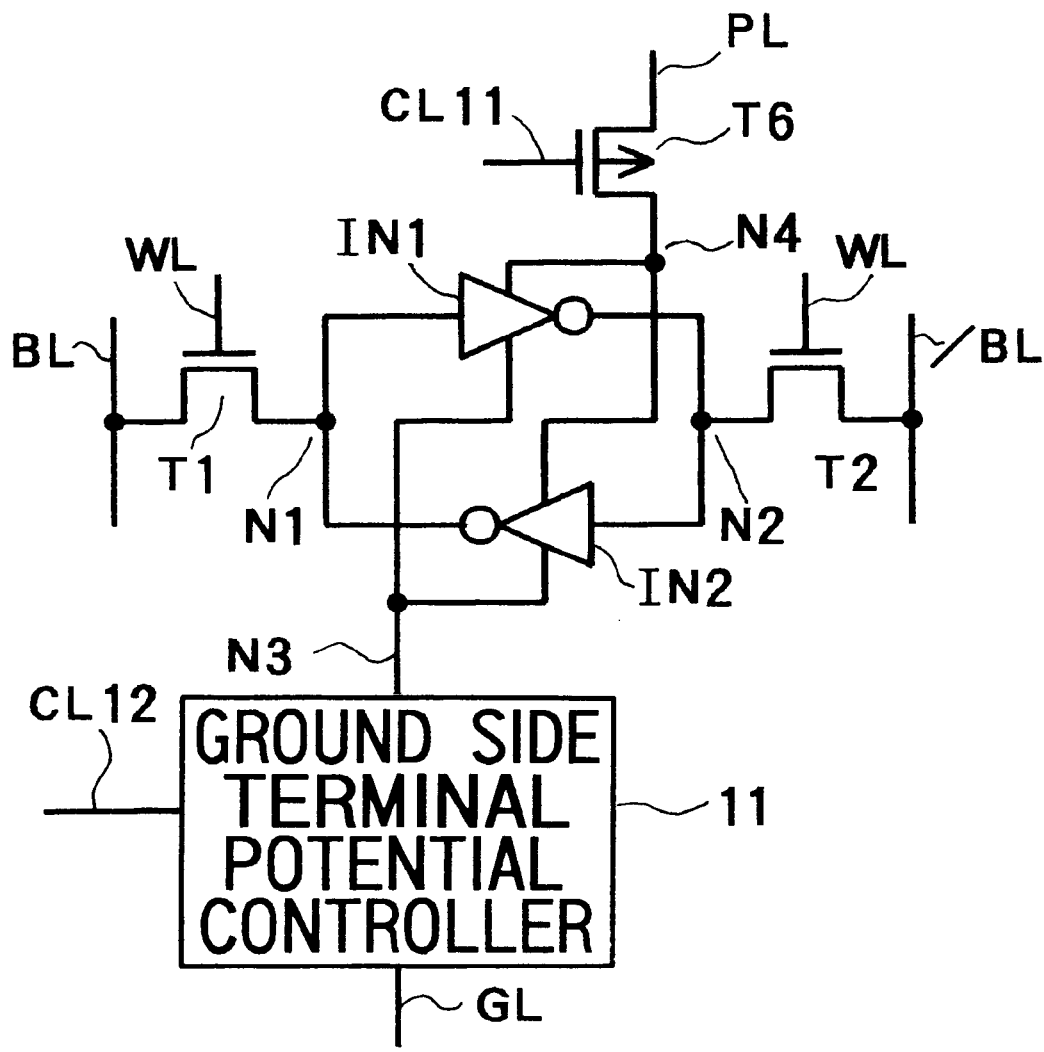
FIG. 5 is a circuit diagram showing the arrangement of a semiconductor memory circuit device according to the third embodiment of the present invention.

FIG. 5 shows the arrangement of a semiconductor memory circuit device according to the third embodiment of the present invention. In the first and second embodiments described above, the potential of one node N3 between the cross-connected inverters IN1 and IN2 is controlled by the transistors T3 and T4 or the transistors T3 and T5. In the third embodiment, a ground side terminal potential controller 11 is connected between a node N3 and a ground line GL, and the two terminals of a P-channel MOS transistor T6 are connected between a power supply line PL and the other node N4 between cross-connected inverters IN1 and IN2. The ground side terminal potential controller 11 is controlled by the potential of a control line CL12, and the transistor T6 is controlled by the potential of a control line CL11. In place of the transistors T3 and T4 or T3 and T5 in the first and second embodiments, the ground side terminal potential controller 11 raises the potential of the node N3 to be higher than the ground potential in the initial stage of a data write, and then decreases it to the ground potential. The transistor T6 is used to disconnect the node N4 from the power supply line PL in the initial stage of a data write, and then connect the node N4 to the power supply line PL.

Figures 6A, 6B:
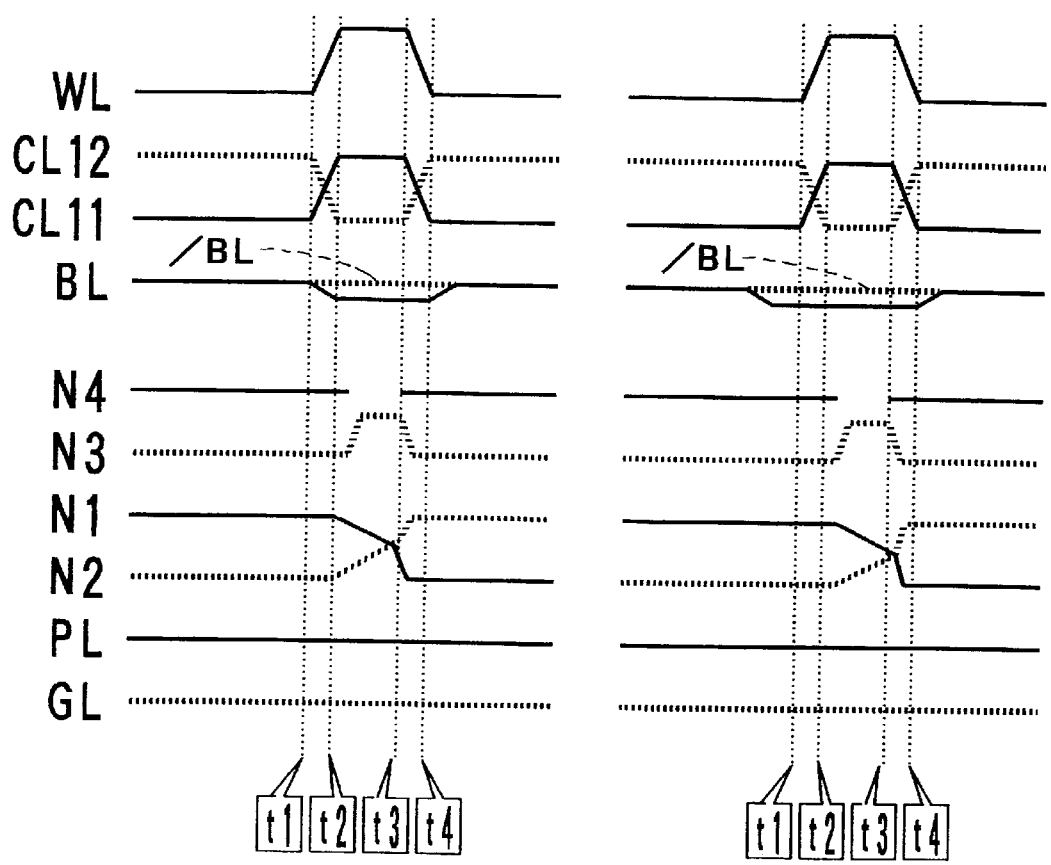
FIGS. 6(a) and 6(b) are timing charts showing the respective signal waveforms in the device.

A write operation in the third embodiment will be described with reference to FIGS. 6(a) and 6(b) showing the potential waveform at each node. Similar to the first and second embodiments, write operations are classified into Method 1 in which data is input to the bit line simultaneously when or after raising the potential of the word line, as shown in FIG. 6(a), and Method 2 in which the potential of the word line is raised after inputting data to the bit line, as shown in FIG. 6(b).

(Method 1)

Bit lines BL and /BL are precharged to the reference potential. The control line CL11 is at the ground potential, the transistor T6 is in the ON state, and the power supply line PL and the node N4 are connected. The level of the control line CL12 is the power supply potential, and the ground side terminal potential controller 11 keeps connecting the node N3 and the ground line GL. With this setting, the inverters IN1 and IN2 receive a potential difference between the power supply potential and the ground potential.

For a time interval from time t1 to time t2, the potential of a word line WL rises to the power supply potential to turn on switching transistors T1 and T2. At the same time as or before/after time t1, the control line CL11 starts rising to the power supply potential. Then, the P-channel MOS transistor T6 is turned off to disconnect the node N4 from the power supply line PL. The potential of the control line CL12 falls, and the ground side terminal potential controller 11 raises the potential of the node N3 to be higher than the ground potential.

At the same time as or after time t1, data is input to the bit lines BL and /BL. The potential difference of the data, i.e., the potential difference between the bit lines BL and /BL is small to a degree capable of writing data in the cross-connected inverters IN1 and IN2 when the potential of the node N3 rises higher than the ground potential while the node N4 is disconnected from the power supply line PL.

The potential of the node N3 starts rising from time t2. The potential of the node N3 rises by the control amount of the ground side terminal potential controller 11, as described above.

The potential difference between the bit lines BL and /BL is written as data in the inverters IN1 and IN2. Although the potential difference between the bit lines BL and /BL is smaller than that between the power supply potential and the ground potential, data can be written in the inverters IN1 and IN2 by raising the potential of the node N3 and disconnecting the node N4 from the power supply line PL. Data is written from time t2 to generate a small potential difference between nodes N1 and N2. The potentials held by the inverters IN1 and IN2, i.e., the potentials of the nodes N1 and N2 reach a potential difference with which the data is not destroyed when the potential of the node N3 is decreased to the ground potential, and the node N4 is connected to the power supply line PL.

Simultaneously when the potential difference between the nodes N1 and N2 reaches the value with which the data is not destroyed even if the potential of the node N3 is decreased to the ground potential, or for a subsequent time interval from time t3 to time t4, the potential of the word line WL is decreased. At the same time as or after time t3, the potential of the control line CL11 is decreased to the ground potential to turn on the transistor T6. The potential of the control line CL12 starts rising, and the ground side terminal potential controller 11 decreases the potential of the node N3 to the ground potential.

Simultaneously when the potential of the word line WL falls to the ground potential at time t4 to turn off the transistors T1 and T2, precharge of the bit lines BL and /BL starts to raise the potential of the bit line /BL to the reference potential.

The node N4 is connected to the power supply line PL to be at the power supply potential, and the potential of the node N3 falls to the ground potential. The small potential difference written in the inverters IN1 and IN2, i.e., the potential difference between the nodes N1 and N2 is amplified to a difference between the power supply potential and the ground potential.

(Method 2)

The bit lines BL and /BL are precharged to the reference potential. The control line CL11 is at the ground potential, the transistor T6 is in the ON state, and the power supply line PL and the node N4 are connected. The control line CL12 is at the power supply potential, and the ground side terminal potential controller 11 connects the node N3 and the ground line GL.

Before time t1, data is input to the bit lines BL and /BL. Similar to Method 1, the potential difference of the data is small. At the same time as or before/after input of the data, the potential of the control line CL11 is raised to the power supply potential. Then, the P-channel MOS transistor T6 is turned off, and the node N4 is disconnected from the power supply line PL. The potential of the control line CL12 falls, and the potential of the node N3 rises higher than the ground potential by the control amount of the ground side terminal potential controller 11.

For a time interval from time t1 to time t2, the potential of the word line WL rises to the power supply potential to turn on the switching transistors T1 and T2.

The potential difference between the bit lines BL and /BL is written as data in the inverters IN1 and IN2. From time t2, data is written to generate a small potential difference between the nodes N1 and N2. The potentials held by the inverters IN1 and IN2, i.e., the potentials of the nodes N1 and N2 reach a potential difference with which the data is not destroyed when the potential of the node N3 is decreased to the ground potential, and the node N4 is connected to the power supply line PL.

Simultaneously when the potential difference between the nodes N1 and N2 reaches the value with which the data is not destroyed even if the potential of the node N3 is decreased to the ground potential, or for a subsequent time interval from time t3 to time t4, the potential of the word line WL falls. At the same time as or after time t3, the potential of the control line CL11 falls to the ground potential to turn on the transistor T6. The potential of the control line CL12 starts rising, and the ground side terminal potential controller 11 decreases the potential of the node N3 to the ground potential.

Simultaneously when the potential of the word line WL falls to the ground potential at time t4 to turn off the transistors T1 and T2, precharge of the bit lines BL and /BL starts to raise the potential of the bit line /BL to the reference potential.

The node N4 is connected to the power supply line PL to be at the power supply potential, and the potential of the node N3 falls to the ground potential. The small potential difference written in the inverters IN1 and IN2, i.e., the potential difference between the nodes N1 and N2 is amplified to a difference between the power supply potential and the ground potential.

According to the third embodiment, a potential difference necessary for a write can be reduced by raising the potential of the node N3 serving as the ground side terminal of the memory cell to be higher than the ground potential in the initial stage of a write, and disconnecting the node N4 serving as the power supply side terminal from the power supply line PL. For this reason, the potential difference between the bit lines BL and /BL can be set smaller to reduce the time and power consumption required to drive the bit lines BL and /BL having a heavy load.

Since changes in potentials of the bit lines BL and /BL in the initial stage of a write can be suppressed small, the time and power consumption required to precharge the bit line having undergone a write to the reference potential can also be reduced.

Since the potential of the node N3 is higher than the ground potential in the initial stage of a write, the potentials of the -ground side terminals of the transistors constituting the inverters IN1 and IN2 rise. Accordingly, the current amount flowing from the bit lines BL and /BL and the power supply line PL to the ground line GL at the beginning of a write can be decreased. Since the node N4 is disconnected from the power supply line PL in the initial stage of a write, no current flows from the power supply line PL to the ground line GL to reduce the total current amount in a write.

The above-described embodiments are merely examples, and do not limit the present invention. For example, each circuit arrangement shown in FIGS. 1, 3, or 7 is a merely example, and can be variously modified.

What is claimed is:

1. A semiconductor memory circuit device comprising:

a semiconductor memory cell for receiving and holding data;

potential control means for controlling a potential of a ground side terminal connected to said semiconductor memory cell;

connection control means for controlling connection of said semiconductor memory cell and a power supply potential terminal; and transfer control means for controlling transfer of data from a bit line to said semiconductor memory cell, wherein, after said potential control means raises the potential of said ground side terminal to be higher than a ground potential by a predetermined potential in writing data, said connection control means disconnects said semiconductor memory cell from said power supply potential terminal, and said transfer control means transfers data having a potential difference smaller than a potential difference between a power supply potential and the ground potential from said bit line to said semiconductor memory cell, said potential control means decreases the potential of said ground side terminal to the ground potential, and amplifies the written small potential difference so that the data written in said semiconductor memory cell is not destroyed even if the potential of said ground side terminal is decreased to the ground potential, and said connection control means connects said semiconductor memory cell and said power supply potential terminal.

2. The device according to claim 1, wherein said semiconductor memory cell has two cross-connected inverters, said potential control means has a P-channel MOS transistor which has two terminals connected between said ground side terminal commonly connected to said two inverters, and a ground potential terminal, and receives a control signal at a gate, and an N-channel MOS transistor which has two terminals connected parallel to said P-channel MOS transistor between said ground side terminal and said ground potential terminal, and receives the control signal at a gate, said connection control means has first switching means having two terminals connected between a power supply side terminal commonly connected to said two inverters, and said power supply potential terminal, said transfer control means has second and third switching means each having two terminals respectively connected between first and second nodes cross-connecting said two inverters, and a pair of bit lines, and after said P-channel MOS transistor of said potential control means is turned on by the control signal to raise the potential of said ground side terminal to be higher than the ground potential by a threshold voltage and an ON resistance, said first switching means of said connection control means disconnects said power supply side terminal from said power supply potential terminal, and said switching means of said transfer control means transfer the data having the potential difference smaller than the potential difference between the power supply potential and the ground potential from said pair of bit lines to said semiconductor memory cell, and cause said semiconductor memory cell to hold the data, said N-channel MOS transistor of said potential control means is turned on by the control signal, or said N-channel MOS transistor and said P-channel MOS transistor are turned on by the control signal to decrease the potential of said ground side terminal to the ground potential, and said switching means of said connection control means connects said power supply side terminal and said power supply potential terminal.

3. The device according to claim 1, wherein said semiconductor memory cell has two cross-connected inverters, said potential control means has a first N-channel MOS transistor which has two terminals connected between said ground side terminal commonly connected to said two inverters, and a ground potential terminal, and receives a first control signal at a gate, and a second N-channel MOS transistor which has two terminals connected parallel to said first N-channel MOS transistor between said ground side terminal and said ground potential terminal, receives a second control signal at a gate, and has an ON resistance higher than an ON resistance of said first N-channel MOS transistor, said connection control means has first switching means having two terminals connected between a power supply side terminal commonly connected to said two inverters, and said power supply potential terminal, said transfer control means has second and third switching means each having two terminals respectively connected between first and second nodes cross-connecting said two inverters, and a pair of bit lines, and after said second N-channel MOS transistor of said potential control means is turned on by the second control signal to raise the potential of said ground side terminal to be higher than the ground potential by the ON resistance, said first switching means of said connection control means disconnects said power supply side terminal from said power supply potential terminal, and said switching means of said transfer control means transfer the data having the potential difference smaller than the potential difference between the power supply potential and the ground potential from said pair of bit lines to said semiconductor memory cell, and cause said semiconductor memory cell to hold the data, said first N-channel MOS transistor of said potential control means is turned on by the first control signal, or said first and second N-channel MOS transistors are turned on by the first and second control signals to decrease the potential of said ground side terminal to the ground potential, and said switching means of said connection control means connects said power supply side terminal and said power supply potential terminal.

4. A semiconductor memory circuit device comprising:

a semiconductor memory cell for receiving and holding data;

potential control means for controlling a potential of a ground side terminal connected to said semiconductor memory cell;

supply current control means for controlling a supply current from a power supply potential terminal to said semiconductor memory cell; and transfer control means for controlling transfer of data from a bit line to said semiconductor memory cell, wherein, after said potential control means raises the potential of said ground side terminal to be higher than a ground potential by a predetermined potential in writing data, said supply current control means decreases the supply current from said power supply potential terminal to said semiconductor memory cell, and said transfer control means transfers data having a potential difference smaller than a potential difference between a power supply potential and the ground potential to said semiconductor memory cell, said potential control means decreases the potential of said ground side terminal to the ground potential, and amplifies the written small potential difference when the data written in said semiconductor memory cell is not destroyed even if the potential of said ground side is decreased to the ground potential, and said supply current control means increases the supply current from said power supply potential terminal to said semiconductor memory cell.

5. The device according to claim 4, wherein said semiconductor memory cell has two cross-connected inverters, said potential control means has a P-channel MOS transistor which has two terminals connected between said ground side terminal commonly connected to said two inverters, and a ground potential terminal, and receives a control signal at a gate, and an N-channel MOS transistor which has two terminals connected parallel to said P-channel MOS transistor between said ground side terminal and said ground potential terminal, and receives a second control signal at a gate, said supply current control means has first control means having two terminals connected between a power supply side terminal commonly connected to said two inverters, and said power supply potential terminal, said transfer control means has second and third switching means each having two terminals respectively connected between first and second nodes cross-connecting said two inverters, and a pair of bit lines, and after said P-channel MOS transistor of said potential control means is turned on by the control signal to raise the potential of said ground side terminal to be higher than the ground potential by a threshold voltage and an ON resistance, said first control means of said supply current control means decreases the supply current from said power supply potential terminal to said semiconductor memory cell, and said switching means of said transfer control means transfers the data having the potential difference smaller than the potential difference between the power supply potential and the ground potential from said pair of bit lines to said semiconductor memory cell, and cause said semiconductor memory cell to hold the data, said N-channel MOS transistor of said potential control means is turned on by the control signal, or said N-channel MOS transistor and said P-channel MOS transistor are turned on by the control signal to decrease the potential of said ground side terminal to the ground potential, and said control means of said supply current control means
increases the supply current from said power supply
potential terminal to said semiconductor memory cell.

6. The device according to claim 4, wherein said semiconductor memory cell has two cross-connected inverters, said potential control means has a first N-channel MOS transistor which has two terminals connected between said ground side terminal commonly connected to said two inverters, and a ground potential terminal, and receives a first control signal at a gate, and a second N-channel MOS transistor which has two terminals connected parallel to said first N-channel MOS transistor between said ground side terminal and said ground potential terminal, receives a second control signal at a gate, and has an ON resistance higher than an ON resistance of said first N-channel MOS transistor, said supply current control means has first control means having two terminals connected between a power supply side terminal commonly connected to said two inverters, and said power supply potential terminal, said transfer control means has second and third switching means each having two terminals respectively connected between first and second nodes cross-connecting said two inverters, and a pair of bit lines, and after said second N-channel MOS transistor of said potential control means is turned on by the first control signal to raise the potential of said ground side terminal to be higher than the ground potential by the ON resistance, said first control means of said supply current control means decreases the supply current from said power supply potential terminal to said semiconductor memory cell, and said switching means of said transfer control means transfer the data having the potential difference smaller than the potential difference between the power supply potential and the ground potential from said pair of bit lines to said semiconductor memory cell, and cause said semiconductor memory cell to hold the data, said first N-channel MOS transistor of said potential control means is turned on by the first control signal, or said first and second N-channel MOS transistors are turned on by the first and second control signals to decrease the potential of said ground side terminal to the ground potential, and said control means of said supply current control means increases the supply current from said power supply potential terminal to said semiconductor memory cell.

7. A method of writing data in a semiconductor memory cell, comprising the steps of:

in a write, raising a potential of a ground side terminal connected to said semiconductor memory cell to be higher than a ground potential by a predetermined potential, and disconnecting a power supply side terminal connected to said semiconductor memory cell from a power supply potential terminal;

supplying data having a potential difference smaller than a potential difference between a power supply potential and the ground potential to said semiconductor memory cell to write the small potential difference; and decreasing the potential of said ground side terminal to the ground potential, connecting said power supply side terminal and said power supply potential terminal, and amplifying the written small potential difference when the data written in said semiconductor memory cell is not destroyed even if the potential of said ground side terminal is decreased to the ground potential.

8. A method of writing data in a semiconductor memory cell, comprising the steps of:

in a write, raising a potential of a ground side terminal connected to said semiconductor memory cell to be higher than a ground potential by a predetermined potential, and decreasing a supply current from a power supply potential terminal to said semiconductor memory cell;

supplying data having a potential difference smaller than a potential difference between a power supply potential and the ground potential to said semiconductor memory cell to write the small potential difference; and decreasing the potential of said ground side terminal to the ground potential, increasing the supply current from said power supply potential terminal to said semiconductor memory cell, and amplifying the small potential difference written in the preceding step when the data written in said semiconductor memory cell is not destroyed even if the potential of said ground side terminal is decreased to the ground potential.

* * * * *